United States Patent
Horng et al.

(10) Patent No.: US 7,222,419 B2
(45) Date of Patent: May 29, 2007

(54) METHOD OF FABRICATING A CERAMIC SUBSTRATE WITH A THERMAL CONDUCTIVE PLUG OF A MULTI-CHIP PACKAGE

(75) Inventors: Gwo-Ji Horng, Taoyuan Hsien (TW); Jen-I Kuo, Chiayii (TW); Feng-Ger Hsiau, Nantou Hsien (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 607 days.

(21) Appl. No.: 10/034,030

(22) Filed: Dec. 19, 2001

(65) Prior Publication Data
US 2003/0110629 A1    Jun. 19, 2003

(51) Int. Cl.
  *H05K 3/36* (2006.01)
(52) U.S. Cl. ............ 29/830; 29/831; 29/832; 29/846; 29/852; 156/89.11; 156/230; 156/235; 438/618; 438/761
(58) Field of Classification Search .......... 29/852, 29/830, 846, 847, 832, 854, 831, 851; 174/262, 174/260; 156/89.16, 277; 264/616, 620, 264/642; 428/210–214; 361/795
See application file for complete search history.

(56) References Cited

U.S. PATENT DOCUMENTS

| | | | | |
|---|---|---|---|---|
| 5,102,720 A | * | 4/1992 | Raj | 421/209 |
| 5,729,893 A | * | 3/1998 | Tanifuji et al. | 29/830 |
| 5,855,711 A | * | 1/1999 | Arki et al. | 156/89.16 |
| 6,326,561 B1 | * | 12/2001 | Watanable et al. | 174/264 |
| 2003/0110629 A1 | * | 6/2003 | Horng et al. | 29/854 |

FOREIGN PATENT DOCUMENTS

EP    0390944    * 10/1990

* cited by examiner

*Primary Examiner*—Minh Trinh
(74) *Attorney, Agent, or Firm*—J.C. Patents

(57) ABSTRACT

A method of fabricating a thermal conductive plug of a ceramic substrate of a multi-chip package. A plurality of conductive openings and thermal conductive openings are formed on green tapes. A metal paste is filled into the conductive openings and the thermal conductive openings. The green tapes are stacked together so that the metal paste inside the conductive openings and the thermal conductive openings of every green tape is in contact respectively with its neighboring metal paste within the conductive openings and thermal conductive openings of the green tapes. Cofire those green tapes and the metal paste to form a pre-substrate. The pre-substrate comprises an insulating structure, a plurality of thermal conductive plugs and conductive plugs.

23 Claims, 4 Drawing Sheets

METHOD OF FABRICATING A CERAMIC SUBSTRATE WITH A THERMAL CONDUCTIVE PLUG OF A MULTI-CHIP PACKAGE

BACKGROUND OF THE INVENTION

1. Field of Invention

The present invention relates generally to a method of fabricating a ceramic substrate with a thermal conductive plug of a multi-chip package. More particularly, the present invention relates to a method of improving the fabricating process of the thermal conductive plug in the ceramic substrate in order to increase performance of the ceramic substrate of a multi-chip package.

2. Description of the Related Art

The demand of advanced electronic technology requires electronic products to be made lighter, thinner, faster, and smarter while simultaneously making them more friendly, powerful, reliable, robust, and less expensive. Thus, the trend for electronic packages is to develop highly-integrated packaging structures. Various techniques have been developed for having a large number of input/output points (I/O) in a device. The ceramic substrate is being widely utilized due to the desirable properties. Because the ceramic substrate has similar thermal expansion coefficient to the semiconductor device, thus a larger area of a chip can be used on the ceramic substrate and the detaching problem between the chip and the ceramic substrate can be prevented. Further, the ceramic substrate dose not absorb the moisture from the air, therefore, the 'pop-corn' effect and the peeling problem during the packaging can be effectively prevented.

Due to the complicated functions of the chip, a lot of heat dissipating problems are still required to be resolved. One of the methods of dissipating heat is to form a plurality of thermal conductive plugs under the die pad of the substrate. The heat generated from the chip will be conducted through the die pad and thermal conductive plugs to a ground plate located on the other side of the substrate. The ground plate is thermally conducted to other thermal conductive devices so that the heat generated from the chip can then be dissipated out to the external environment.

The conventional method of fabricating the thermal conductive plug inside the ceramic substrate is to perform the step of forming the thermal conductive plugs after cofiring the ceramic substrate. However, since the hardness of the ceramic substrate is very high, and the ceramic substrate is very brittle plus its measurement is very thick. Therefore, the only way to drill the thermal conductive holes in the ceramic substrate is by a laser method. A stencil printing method is carried out to fill the metal paste into the thermal conductive holes and followed by cofiring the metal paste so that thermal conductive plugs are formed in the thermal conductive holes.

From the above-mentioned fabrication, the formation of the thermal conductive holes on the ceramic substrate has to be by laser. However, in order to penetrate through the high hardness of thick ceramic substrate, a lot of energy is required. The high power of a laser machine is very expensive. On the other hand, the size of the metal conductive plug will be reduced after cofiring the metal paste in the thermal conductive holes. After cofiring, the size of the thermal conductive holes remains unchanged and the size of the thermal conductive plugs are shrunken, therefore, voids will be formed in the thermal conductive holes. The thermal conductivity will be inefficient and those voids will lead to produce rents in the ceramic substrate. The worst is that the thermal conductive plugs will even fall out from the holes. As a result, specific materials for the metal paste have to be chosen to use so that the volume will not shrink but rather expand during the cofiring process. However, the fabrication is then limited to the selection of the materials of the metal paste.

SUMMARY OF THE INVENTION

It is an object of the present invention provides a method of fabricating a ceramic substrate with a thermal conductive plug of a multi-chip package that can effectively reduce the production cost by using a punching method to form the thermal conductive holes.

It is another object of the present invention to provide an improved method of fabricating a thermal conductive plug inside a ceramic substrate of a multi-chip package that can simplify the whole fabricating process. The method of the invention not only allow the thermal conductive holes to be completely filled with the metal paste but it also allow the thermal conductive plugs to be fabricated simultaneously while the cofiring process is proceeding on the ceramic substrate.

To achieve the foregoing and other objects and in accordance with the purpose of the present invention. A plurality of green tapes is provided. A machine punching method is carried out to forming a plurality of conductive openings and thermal conductive openings on green tapes. A maximum width of the thermal conductive opening is approximately between 20 milli-inches to 40 milli-inches. A metal paste is filled into the conductive openings and the thermal conductive openings. A heating process is performed to stack the green tapes together, wherein the metal paste inside the conductive openings of every green tape is in contact with its neighboring metal paste within the conductive openings of the green tapes. The metal paste inside the thermal conductive openings of the green tapes is in contact with each neighboring metal paste inside the thermal conductive openings. Cofire those green tapes and the metal paste to form a pre-substrate. The pre-substrate comprises an insulating structure, a plurality of thermal conductive plugs and conductive plugs. The insulating structure is formed by cofiring the green tapes so that a plurality of conductive plugs are formed due to the cofiring on the metal paste in the conductive openings. A plurality of thermal conductive plugs is also formed by cofiring the metal paste inside the thermal conductive openings. The pre-substrate further comprises a top surface and a bottom surface. A sputtering deposition is performed to form a first metal film on the top surface of the pre-substrate and a second metal film on the bottom surface of the pre-substrate. A plurality of die pads and conductive traces are formed by patterning the first metal film. The die pads in contacted with the thermal conductive plugs and the conductive traces in contacted with the conductive plugs. A plurality of chips is adhered on the die pads and is electrically connected to the conductive traces.

In one preferred embodiment of the invention, a polishing method is carried out to planarize the top surface and the bottom surface of the pre-substrate after cofiring the green tapes and the metal paste. A flat insulating layer is formed on the top surface and bottom surface of the pre-substrate during the planarizating process. A plurality of openings are formed on the insulating layer to exposure the conductive plugs and the thermal conductive plugs.

The pre-substrate further comprises a plurality of aligning-mark holes, which are formed into cavity-shaped holes and are used to align a mask layer to the pre-substrate. A fabricating method of the aligning-mark holes includes forming a plurality of aligning hole on a predetermined number of green tapes while forming the conductive openings and the thermal conductive openings on the green tapes. The green tapes are aligned to each other according to the aligning holes on the predetermined number of green tapes and are stacked together with the green tapes without the aligning holes. After cofiring the green tapes and the metal paste a plurality of aligning-mark holes is formed from the aligning holes.

Therefore, the heat generated from the chip is conducted through the die pad to the thermal conductive plug then to the second metal film. From the second metal film, the heat is then dissipated out to the external environment from the second metal film. Since, the ceramic substrate can dissipate heat easily to the outside, thus, a powerful chip can be utilized in the invention.

The foregoing fabrication disclosed that the conductive openings, the thermal conductive openings and the aligning holes are formed by the machine punching method. Therefore, these features can be fabricated on the green tapes simultaneously by one punching process. Thus, the fabrication process is simplified and much faster plus less costly. Further, the conductive plug, the thermal conductive plugs and the aligning-mark hole can also be fabricated simultaneously in the cofiring process. Thus, the fabrication process of the ceramic substrate with the thermal conductive plug is simplified. In addition, since the metal paste is filled into the conductive opening and the thermal conductive openings before heating process. Therefore, the material selection of the metal paste is more flexible. The thickness of the ceramic substrate can be controlled in accordance with the layer number of the green tapes. The size of circuit traces of the circuit fabrication can be accurately controlled by the sputtering deposition of forming the metal film and the photographic etching process. Moreover, the present invention also provides an easy method to fabricate the aligning hole so that the aligning hole can be used to align the mask layer during the photographic etching process.

Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
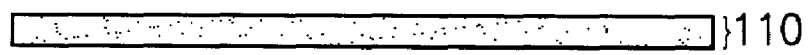
FIGS. 1–12 are magnified cross-sectional views of fabricating a ceramic substrate with a thermal conductive plug of a multi-chip package in accordance with a preferred embodiment of the present invention.
Figure 2:
Figure 3:
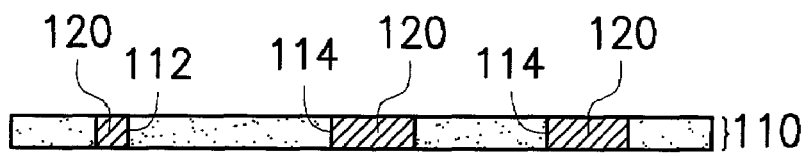
Figure 4:
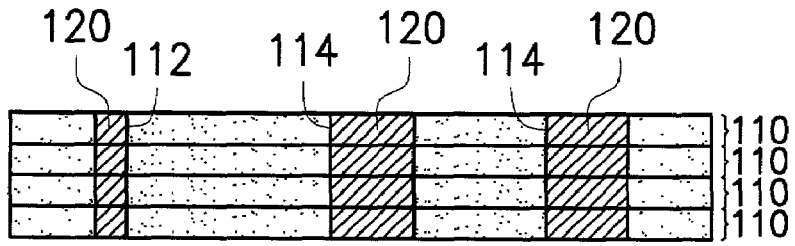

FIGS. 1–12 illustrate magnified cross-sectional views of fabricating a ceramic substrate with a thermal conductive plug in accordance with a preferred embodiment of the present invention. Referring to FIG. 1, a plurality of green tapes 110 are provided (only one of the green tapes 110 is shown in FIGS. 1–3). The green tape 110 is made of materials consisting of low temperature glass, ceramic power, a dispersant and an adhesion. The dispersant is a material used for preventing the low temperature glass and the ceramic power from agglomerating together. The adhesion is a material used for making the green tape 110 to be adhesive.

Referring to FIG. 2, a plurality of conductive openings 112 (only one is shown in the FIGS. 2–4) and a plurality of thermal conductive openings 114 are formed on the green tape 110 by utilizing a machine pouching method. A maximum width of the conductive opening 112 is approximately between 5 milli-inches to 15 milli-inches, and a maximum width of the thermal conductive openings 114 is about 20 milli-inches to 40 milli-inches. A stencil printing method is carried out to fill the conductive opening 112 and the thermal conductive openings 114 with a metal paste 120 so that a structure of the green tape 110 shown in FIG. 3 can be formed. The metal paste 120 is made of materials including a low temperature glass material, metal power, a dispersant and an adhesion. The dispersant is a material used for preventing the low temperature glass and the ceramic power from agglomerating together. The adhesion is a material used for making the green tape 120 to be adhesive. The metal power can be selected from a metal group consisting of silver or gold or copper.

Figure 5:
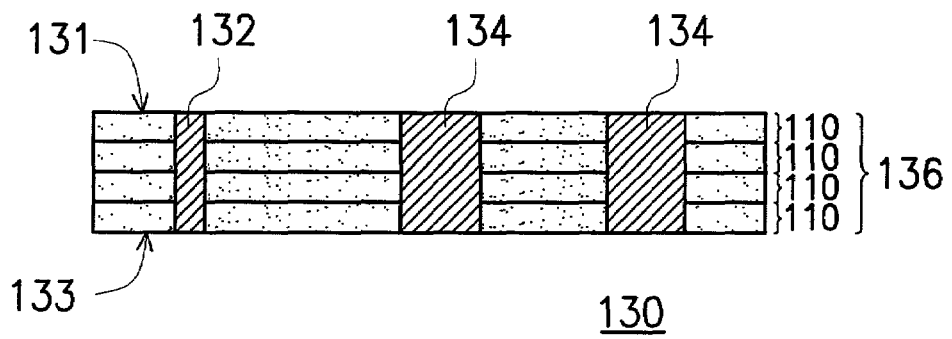

A stacking process is performed to interlap the plurality of green tapes 110 through a heat pressing method so that the metal paste inside the conductive openings 112 of every green tape 110 can be in conducted with each other. The metal paste inside the thermal conductive openings 114 of each green tape 110 is also in conducted with each other. A cofiring process is carried out to heat up the green tapes 110 and the metal paste 120 at a predetermined temperature for a certain period so that organic materials inside the green tapes 110 and the metal paste 120 such as the dispersant, the adhesion are all vaporized. The green tapes 110 and the metal paste 120 are then heated up to a higher temperature in order to cofire and solidify the low temperature glass material inside the green tapes 110 and the metal paste 120. Therefore, a structure shown in FIG. 5 is formed and is used as a pre-substrate 130. The pre-substrate 130 further comprises an insulating structure 136, a plurality of thermal conductive plugs 134 and a plurality of conductive plugs 132. The insulating structure 136 is formed by cofiring the green tapes 110 and the thermal conductive plugs 134 are formed by cofiring the metal paste 120 inside the thermal conductive openings 114. The conductive plugs 132 are also formed by cofiring the metal paste 120 inside the conductive openings 112. The pre-substrate 130 has a top surface 131 and a corresponding back surface 133.

On the other hand, the circuit traces and the formation of plugs can all be fabricated during the stencil printing process, after stacking and heating process, the metal circuit traces can then be formed between each green tape 110.

Figure 6:
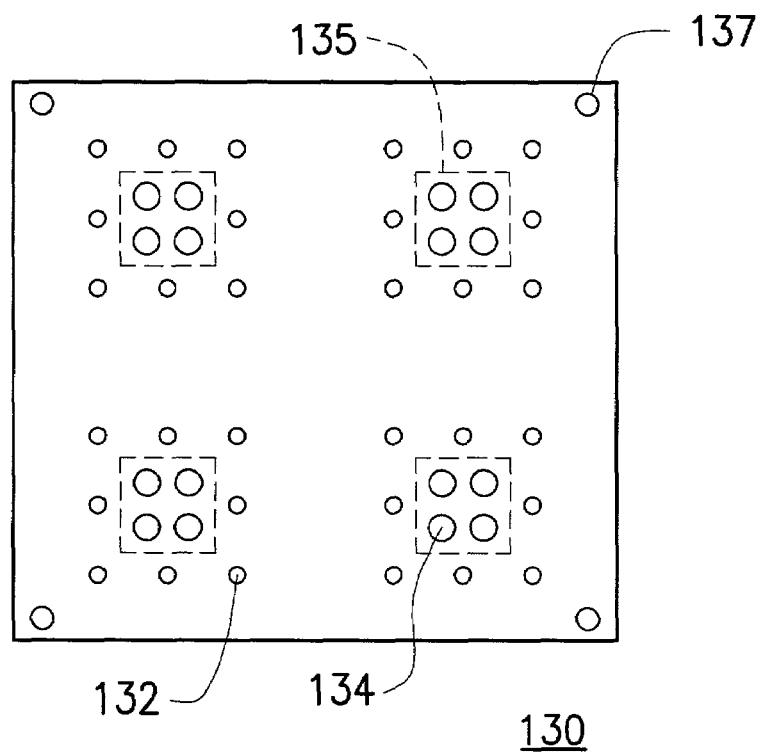

Referring to FIG. 6, showing a schematic top view of a pre-substrate. A dotted-line region 135 indicates a location for a die pad (not shown). The thermal conductive plugs 134 will be formed within the dotted-line region 135. The pre-substrate 130 can carry a plurality of chips (not shown) through the multiple number of die pads. The conductive plugs 132 are formed outside the dotted-line region 135. A plurality of aligning-mark holes 137 are formed and located on a peripheral region of the pre-substrate 130. A schematic cross-sectional vies of the aligning-mark hole 137 is shown in FIG. 7.

Figure 7:
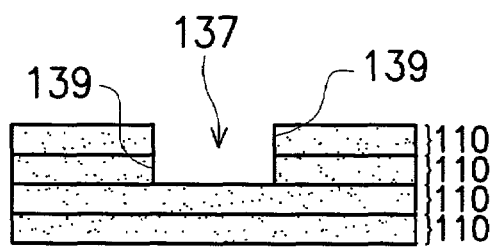

Referring to FIG. 7, the machine punching method that is used to fabricate the conductive openings and the thermal conductive openings on the green tapes is also used to form the plurality of aligning holes 139 onto a predetermined number of green tapes 110. During the stacking process, those green tapes 110 with the aligning holes 139 are aligned according the aligning holes 139 and stacked together. Those green tapes 110 with aligning holes 139 are then stacked together with other green tapes 110 without the aligning holes 139. After the heating and filling with the metal paste processes, the aligning holes 139 are formed into the aligning-mark holes 137 in the pre-substrate 130. Since those aligning-mark holes 137 are not drilled through holes, thus cavity-shaped of these aligning-mark holes 137 are induced in the pre-substrate 130. A diameter of the aligning-mark holes 137 is approximately between 10 milli-inches to 25 milli-inches.

Figure 8:
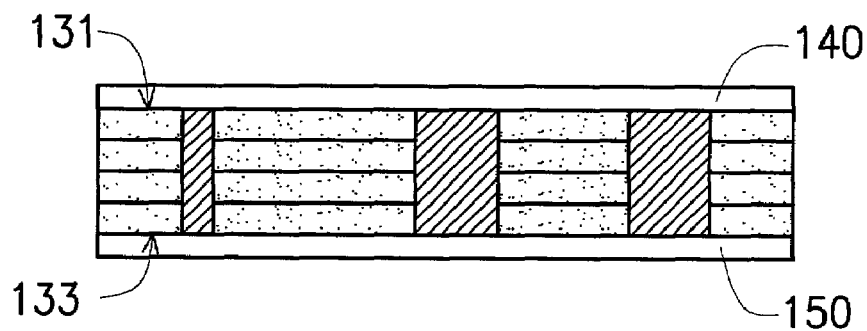
Figure 9:
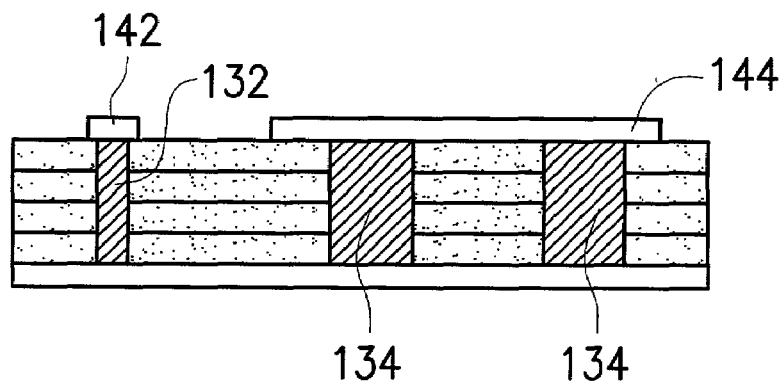

A planarazing process, such as a polishing method, is performed to planarize the top surface 131 and the back surface of the pre-substrate 130. A sputtering deposition or an evaporation method is used to form a first metal film 140 on the top surface 131 of the pre-substrate 130 and a second metal film 150 on the bottom surface 133 of the pre-substrate 130 as shown in FIG. 8. In FIG. 9, the first metal film 140 is patterned by utilizing a photographic etching method to form a plurality of die pads 144 (only one is shown) and conductive wires 142 (only one is shown). The die pads 144 are in contacted with the thermal conductive plugs 134 and the conductive wires 142 are in contacted with the conductive plugs 132.

Figure 10:
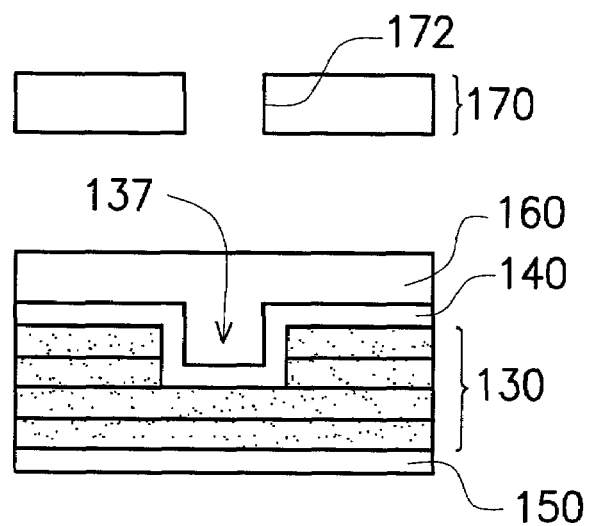

FIG. 10 illustrates a schematic view of aligning a pre-substrate to a peripheral region of an aligning-mark hole during a photographic etching process. During the photographic etching process, a spin-on method is used to form a photoresist layer 160 on the first metal film 140. Then, an exposure process is carried out to a mask layer 170 consisting of a die pad pattern (not shown) and a conductive-trace pattern (not shown) so that the die pad pattern and the conductive trace pattern can be formed. The mask layer 170 is properly aligned with the pre-substrate 130 through aligning an aligning hole 172 of the mask layer 170 to the aligning mark hole 137 of the pre-substrate 130. So that the patterns of the mask layer 170 can be accurately transferred to the photoresist layer 160. A photographic etching process is carried out to remove portions of the photoresist layer 160 that are not for forming the die pads and the conductive wires. Thus, remaining portions of the photoresist layer 160 are then used for forming the die pads and the conductive wires. An etching process is performed to remove a portion of the first metal film 140 that is exposed outside the photoresist layer 160. The remaining portions of the photoresist layer 160 are then removed to form a structure shown in FIG. 9. In the preferred embodiment of the present invention, the second metal film 150 can be used as a circuit connection for the ground plate. However, the second metal film 150 can also be patterned by the photographic etching method to form a plurality of conductive wires for a complex circuit on the substrate.

Figure 11:
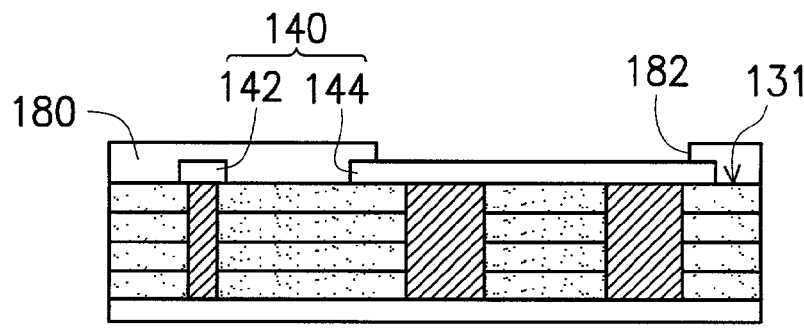

Referring to FIG. 11, an alternative process can be chosen to form a protective layer 180 on the first metal film 140 by a spin-on method in order to protect the conductive wires 142 of the first metal film 140. A plurality of openings 182 can be formed on the protective layer 180 by utilizing the photographic etching method. So that the die pad 144 and nodes (not shown) are exposure. Therefore, the ceramic substrate 210 is completely fabricated.

Figure 12:
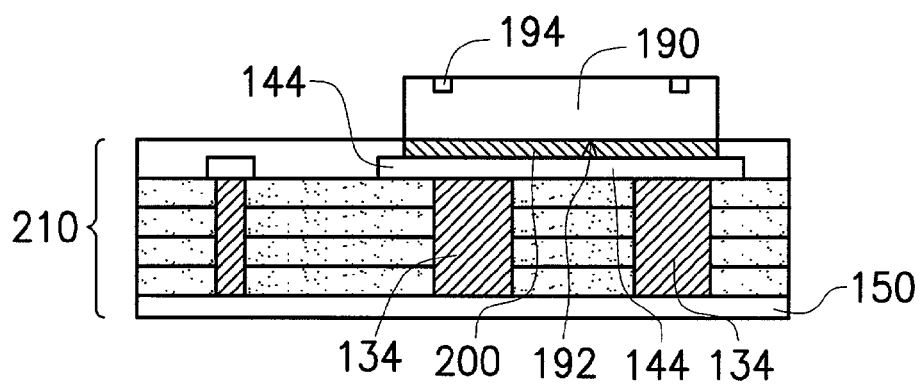

Referring to FIG. 12, an adhesive material 200 is utilized to adhere back surfaces 192 of a plurality of chips 190 to the die pads 144, however, only one chip 190 and one die pad 144 is shown in FIG. 12. A wire bonding process is carried out to electrically connect bonding pads 194 to the nodes. The heat generated from the chip 190 can be conducted through the die pad 144 to the thermal conductive plugs 134 then to the second metal film 150. Finally, the ceramic substrate 210 dissipates the heat to an external environment through the second metal film 150. Therefore, the heat generated from the chip 190 can be dissipated quickly so that a more powerful chip can be utilized.

According to the fabricating process of the ceramic substrate with the thermal conductive plug shown in FIGS. 1–12, the conductive opening 112, thermal conductive opening 114 and the aligning holes 139 are all formed by the machine punching method. Therefore, these features 112, 114 and 139 can be fabricated on the green tapes 110 simultaneously by one punching process. Thus, the fabrication process is simplified and faster plus less costly. Further, the conductive plug 132, the thermal conductive plugs 134 and the aligning-mark hole 172 can also be fabricated simultaneously during the cofiring process. Thus, a simple fabrication process of the ceramic substrate with the thermal conductive plug is induced. Since the metal paste 120 is filled into the conductive opening 112 and the thermal conductive openings 114 before the cofiring process. Therefore, the selection of materials for the metal paste 120 is unrestricted. From the above-described fabrication, the thickness of the ceramic substrate 210 can be controlled in accordance with the layer number of the green tapes 110. The size of circuit traces of the circuit fabrication can be accurately controlled by the sputtering deposition of forming the metal film and the photographic etching process. In addition, the present invention provides an easy method to fabricate the aligning hole 137 so that the aligning hole 137 can be used to align the mask layer 170 during the photographic etching process.

From the above-disclosed embodiment, the polishing method is used to planarize the surfaces of the substrate. However, the present invention is not limited to the polishing method. As a matter of fact, other methods can also be utilized to planarize the surfaces of the substrate.

Figure 13:
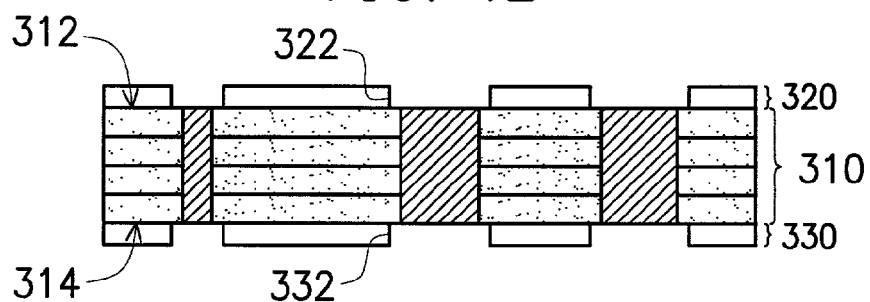
FIGS. 13 and 14 are magnified cross-sectional views of fabricating a ceramic substrate with a thermal conductive plug in accordance with a second preferred embodiment of the present invention.
Figure 14:
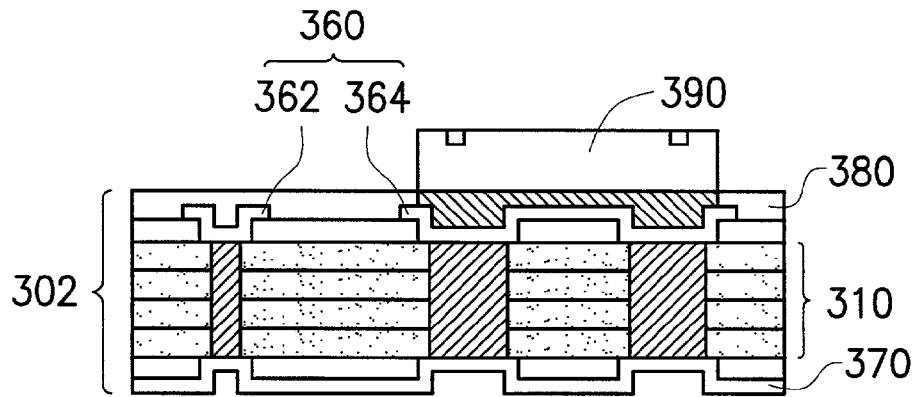

Referring to FIGS. 13 and 14, showing magnified cross-sectional views of fabricating a ceramic substrate with a thermal conductive plug in accordance with a second preferred embodiment of the present invention. FIG. 13, after completed the pre-substrate fabrication, a spin-on method is used to form a flat first insulating layer 320 on the top surface 312 and a flat second insulating layer 330 on the bottom surface 314 of the pre-substrate 310. A photography method is used to form number of openings 322, 332 respectively on the first insulating layer 320 and the second insulating layer 330 in order to exposure the conductive plug 340, thermal conductive plug 350 and the aligning-mark hole. Referring to FIG. 14. A first metal film 360 and a second metal film 370 are formed. A plurality of conductive traces 362 and die pads 364 are formed by photographing on the first metal film 360 and a protective layer 380 is also formed. The chip 390 is adhered onto the die pad 364 and is electrically connected to the ceramic substrate 302.

The fabrication of the ceramic substrate with the thermal conductive plug consists of the following advantages:

1. The heat generated from the chip is conducted through the die pad to the thermal conductive plug then to the second metal film. From the second metal film, the heat is then dissipated out to the external environment from the second metal film. Since, the ceramic substrate can dissipate heat easily to the outside, therefore, a powerful chip can be utilized in the invention.
2. The conductive openings, the thermal conductive openings and the aligning holes all are all formed by the machine punching method. Therefore, these features can be fabricated on the green tapes simultaneously by one punching process. Thus, the fabrication process is simplified and faster plus less costly.
3. The conductive plug, the thermal conductive plugs and the aligning-mark hole can also be fabricated simultaneously during the cofiring process. Thus, a simple fabrication process of the ceramic substrate with the thermal conductive plug is induced.
4. Since the metal paste is filled into the conductive opening and the thermal conductive openings before heating process. Therefore, the selection of materials for the metal paste is less restricted.
5. The thickness of the ceramic substrate can be controlled in accordance with the number of the green tapes used.
6. The size of circuit traces of the circuit fabrication can be accurately controlled by the sputtering deposition of forming the metal film and the photographic etching process.
7. The present invention also provides an easy method to fabricate the aligning holes so that the aligning holes can be used to align the mask layer during the photographic etching process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a ceramic substrate, wherein the method comprises:
    providing a plurality of green tapes;
    forming a plurality of conductive openings and thermal conductive openings passing through the green tapes;
    after forming the conductive openings and the thermal conductive openings, filling a metal paste into the conductive openings and the thermal conductive openings;
    after filling the metal paste into the conductive openings and the thermal conductive openings, stacking the green tapes together, wherein the metal paste inside the conductive openings of every green tape is in contact with neighboring metal paste within the conductive openings of the green tapes, the metal paste inside the thermal conductive openings of each green tape is in contact with the neighboring metal paste inside the thermal conductive openings;
    after stacking the green tapes together, cofiring the green tapes and the metal paste to form a pre-substrate, wherein the pre-substrate comprises an insulating structure, a plurality of thermal conductive plugs and conductive plugs, the insulating structure is formed by cofiring the green tapes so that a plurality of conductive plugs are formed by cofiring the metal paste in the conductive openings and a plurality of thermal conductive plugs are formed by cofiring the metal paste inside the thermal conductive openings, the pre-substrate further comprises a top surface and a bottom surface;
    performing a planarization process after cofiring the green tapes and the metal paste;
    forming a first metal film on the top surface of the pre-substrate;
    forming a second metal film on the bottom surface of the pre-substrate;
    patterning the first metal film to form a plurality of die pads and conductive traces, the die pads in contacted with the thermal conductive plugs and the conductive traces in contacted with the conductive plugs;
    adhering a plurality of chips on the die pads; and
    electrically connecting the chips to the conductive traces.

2. The method of claim 1, wherein a machine punching method is utilized to form the conductive openings and the thermal conductive openings passing through the green tapes.

3. The method of claim 1, wherein a stencil printing method is utilized to fill the metal paste into the conductive openings and the thermal conductive openings.

4. The method of claim 1, wherein a method of forming the first metal film comprises a sputtering deposition or an evaporation method.

5. The method of claim 1, wherein a method of forming the second metal film comprises a sputtering deposition or an evaporation method.

6. The method of claim 1, wherein a maximum width of the thermal conductive opening is approximately between 20 milli-inches to 40 milli-inches.

7. The method of claim 1, wherein the planarization process is carried out to planarize the top surface of the pre-substrate by a polishing method.

8. The method of claim 1, wherein the planarization process is carried out to planarize the bottom surface of the pre-substrate by a polishing method.

9. The method of claim 1, wherein a flat insulating layer is formed on the top surface of the pre-substrate during the planarization process, and a plurality of openings are formed through the insulating layer to expose the conductive plugs and the thermal conductive plugs.

10. The method of claim 1, wherein a flat insulating layer is formed on the bottom surface of the pre-substrate during the planarization process, and a plurality of openings are formed through the insulating layer to expose the conductive plugs and the thermal conductive plugs.

11. The method of claim 1, wherein photolithographic and etching techniques are used to pattern the first metal film.

12. The method of claim 1, wherein the pre-substrate further comprises a plurality of aligning-mark holes, which are formed as cavity-shaped holes and are used to align a mask layer to the pre-substrate.

13. The method of claim 12, wherein a fabricating method of the aligning-mark holes, comprising
    forming a plurality of aligning holes passing through at least one of the green tapes while forming the conductive openings and the thermal conductive openings passing through the green tapes;
    stacking together with the green tapes with the aligning holes, going with the aligning holes aligned with each other, and stacking together with the green tapes without the aligning holes while stacking the green tapes together; and
    forming the aligning-mark holes from the aligning holes after cofiring the green tapes and the metal paste.

14. A method of fabricating a ceramic substrate, comprising:
  providing a plurality of green tapes;
  forming a plurality of thermal conductive openings passing through the green tapes;
  after forming the thermal conductive openings, filling a metal paste into the thermal conductive openings;
  after filling a metal paste into the thermal conductive openings, stacking the green tapes together, wherein the metal paste inside the thermal conductive openings of the green tapes is in contact with neighboring metal paste inside the thermal conductive openings;
  after stacking the green tapes together, cofiring the green tapes and the metal paste to form a pre-substrate, wherein the pre-substrate comprises an insulating structure, at least a thermal conductive plug, the insulating structure is formed by cofiring the green tapes and the thermal conductive plug is formed by cofiring the metal paste inside the thermal conductive openings;
  performing a planarization process after cofiring the green tapes and the metal paste;
  forming a metal film on the pre-substrate; and
  patterning the first metal film to form at least a die pad, and the die pad is in contact with the thermal conductive plug.

15. The method of claim 14, wherein a machine punching method is utilized to form the thermal conductive openings passing through green tapes.

16. The method of claim 14, wherein a stencil printing method is utilized to fill the metal paste into the thermal conductive openings.

17. The method of claim 14, wherein a method of forming the metal film on the pre-substrate comprises a sputtering deposition or an evaporation method.

18. The method of claim 14, wherein the planarization process is carried out to planarize the pre-substrate by a polishing method.

19. The method of claim 14, wherein a flat insulating layer is formed on the pre-substrate during the planarization process, and at least an opening is formed through the insulating layer to expose the thermal conductive plug.

20. The method of claim 14, wherein photolithographic and etching techniques are used to pattern the first metal film.

21. The method of claim 14, wherein pre-substrate further comprises a plurality of aligning-mark holes, which are formed as cavity-shaped holes and are used to align a mask layer to the pre-substrate.

22. The method of claim 21, wherein a fabricating method of the aligning-mark hole, comprising
  forming a plurality of aligning holes passing through at least one of the green tapes while forming the thermal conductive openings passing through the green tapes;
  stacking together with the green tapes with the aligning holes, going with the aligning holes aligned with each other, and stacking together with the green tapes without the aligning holes while stacking the green tapes together; and
  forming the aligning-mark holes from the aligning holes after cofiring the green tapes and the metal paste.

23. The method of claim 14, wherein a maximum width of the thermal conductive opening is approximately between 20 milli-inches to 40 milli-inches.

* * * * *